(12) United States Patent
Takahashi

(10) Patent No.: US 6,254,687 B1
(45) Date of Patent: Jul. 3, 2001

(54) CHEMICAL VAPOR DEPOSITION SYSTEM WITH REDUCED MATERIAL DEPOSITION ON CHAMBER WALL SURFACES

(75) Inventor: Ichiro Takahashi, Kamakura (JP)

(73) Assignee: Japan Process Engineering, Ltd., Kanagawa-Ken (JP)

( * ) Notice: Subject to any disclaimer, the term of this patent is extended or adjusted under 35 U.S.C. 154(b) by 0 days.

(21) Appl. No.: 09/280,024

(22) Filed: Mar. 26, 1999

(51) Int. Cl.$^7$ ..................................................... C23C 16/00
(52) U.S. Cl. ............................. 118/725; 118/729; 118/730
(58) Field of Search ................................. 118/725, 729, 118/730

(56) References Cited

U.S. PATENT DOCUMENTS 4,858,558 * 8/1989 Ohmura et al. ...................... 118/725
5,427,620   6/1995 deBoer et al. .
5,679,405  10/1997 Thomas et al. .

* cited by examiner

Primary Examiner—Richard Bueker
(74) Attorney, Agent, or Firm—Marshall & Melhorn, LLC

(57) ABSTRACT

In a chemical vapor deposition system, susceptors are supported by a pair of turntables which are disposed in a vertical and parallel arrangement. A plurality of wafers to be processed are arranged circumferentially on opposing surfaces of the susceptors, and heater units are arranged behind the turntables. Because the wall surfaces exposed to the material gas are mostly covered by the wafers to be processed, any wasteful deposition of material on the chamber surfaces can be avoided. Thus, the need to clean the surface of the chamber wall is minimized. Such material deposition is not only wasteful but also could become a source of contamination as such deposition tends to peel off.

10 Claims, 1 Drawing Sheet

CHEMICAL VAPOR DEPOSITION SYSTEM WITH REDUCED MATERIAL DEPOSITION ON CHAMBER WALL SURFACES

TECHNICAL FIELD

The present invention relates to a chemical vapor deposition system, and in particular to a chemical vapor deposition system which can prevent undesired deposition of material on surfaces in the reaction chamber.

BACKGROUND OF THE INVENTION

Chemical vapor deposition (CVD) is commonly used for forming thin layers of material known as films over an integrated circuit substrate and other surfaces. The substrate commonly known as a wafer is heated in a reaction chamber, and is exposed to material gases introduced into the chamber. As a result of thermal decomposition and/or reaction of the material gases, a film such as a gallium arsenide compound is formed on the surface of the wafer.

In a system for such a CVD process, as a result of contact with the material gas, unnecessary byproducts such as arsenide tend to be deposited on various surfaces such as the wall surfaces provided opposite to the susceptors for the wafer to be processed for controlling the flow of the material gas. Such byproducts are known to reduce the use efficiency of the material gas, and may cause particulate contaminants that could be included in the deposited layers. Inclusion of such contaminants in the wafer can seriously impair the quality of the integrated circuits, semiconductor devices and other final products.

BRIEF SUMMARY OF THE INVENTION

In view of such problems of the prior art, a primary object of the present invention is to provide a chemical vapor deposition system which can reduce undesired material deposition on the wall surfaces of the reaction chamber so as to minimize the cost and effort required for the maintenance of the chemical vapor deposition system.

A second object of the present invention is to provide a chemical vapor deposition system which is resistant to contamination, and can thereby improve the quality of the CVD products.

A third object of the present invention is to provide a chemical vapor deposition system which can form a uniform film on the surface of the substrate to be treated.

A fourth object of the present invention is to provide a chemical vapor deposition system which can minimize the waste of the material gas.

According to the present invention, these and other objects can be accomplished by providing a chemical vapor deposition system, comprising: a pair of susceptors placed opposite to each other defining a gap therebetween and having opposing surfaces adapted to retain wafers thereon; a conduit for passing material gas through the gap; and a pair of heater units each provided adjacent the other side of the corresponding one of the susceptors.

Thus, the mutually opposing surfaces of the susceptors provide flow control surfaces so that a favorable material gas flow can be achieved. As these surfaces are mostly covered by the wafers to be processed, any wasteful deposition of material on the chamber surfaces can be avoided. Thus, the need to clean the surface of the chamber wall is minimized. Such material deposition is not only wasteful but also could become a source of contamination as such deposition tends to peel off. Also, a relatively large number of wafers can be processed in a limited space within the reaction chamber.

In view of minimizing contamination, the susceptors may be preferably disposed vertically and/or parallel to each other so that any particulate contaminants may drop into the bottom of the reaction chamber without falling onto the surfaces of the wafers, and the material gas may flow without any significant disturbances. For uniform processing of the wafers, the susceptors may be supported by turntables. These turntables may rotate in mutually opposing directions for an optimum result.

According to a preferred embodiment of the present invention, the wafer retaining surfaces of the susceptors are adapted to retain a plurality of wafers in a concentric arrangement so that a maximum number of wafers may be processed in a given space of the reaction chamber. From a similar consideration as well as for achieving a controlled flow of the material gas, the conduit for passing material gas through the gap may be received in a rotary shaft of one of the turntables, and provided with an opening communicating with the gap.

BRIEF DESCRIPTION OF THE DRAWINGS

Now the present invention is described in the following with reference to the appended drawing, in which.

DETAILED DESCRIPTION OF THE PREFERRED EMBODIMENTS

Figure 1:
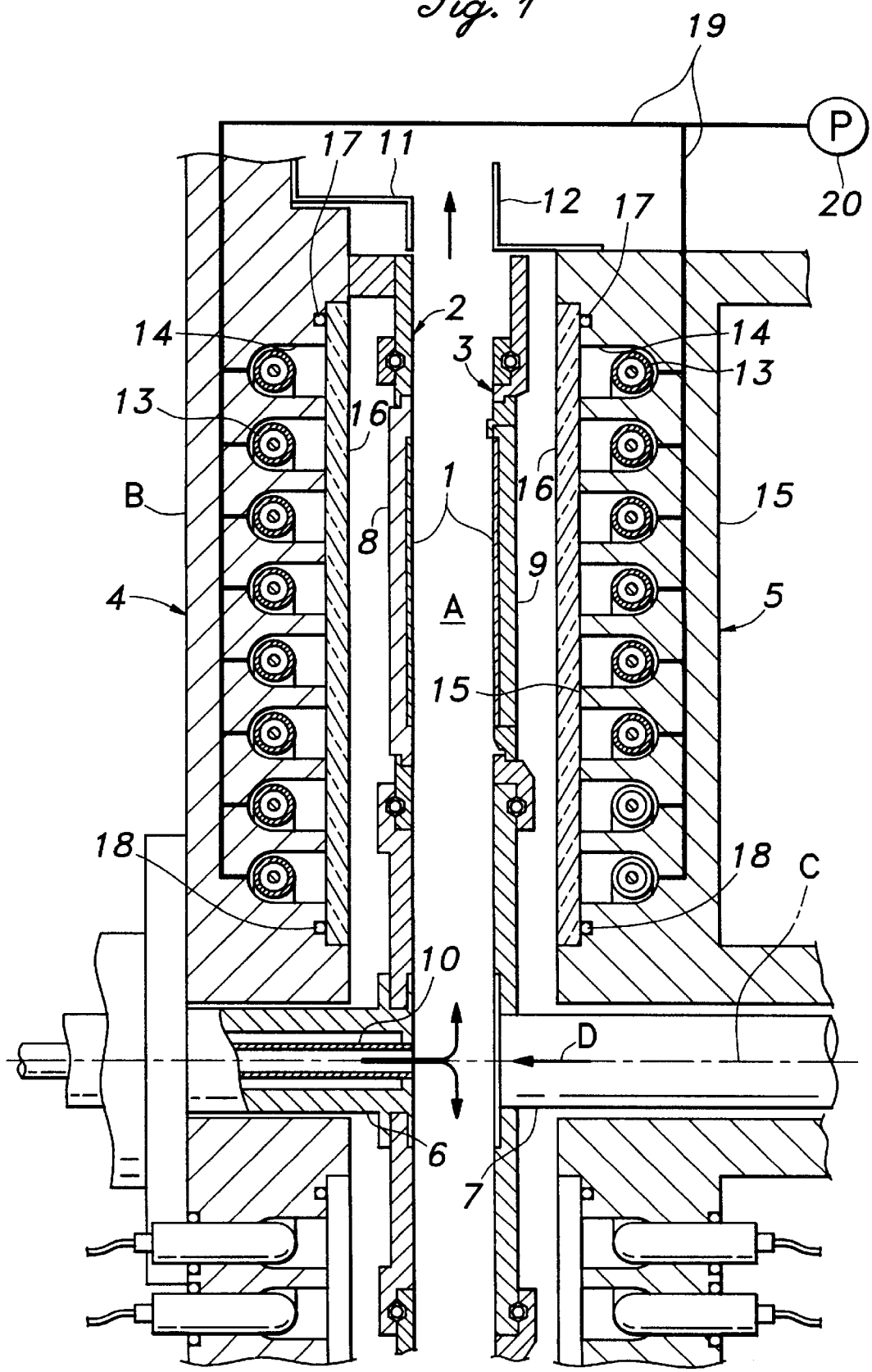
FIG. 1 is a vertical sectional view of a reaction chamber of a CVD system embodying the present invention.

Referring to FIG. 1, the illustrated CVD system embodying the present invention comprises a pair of turntables 2 and 3 which are rotatably supported by a fixed base B via respective hollow rotary shafts 6 and 7. The entire assembly is received in a reaction chamber suitable for carrying out CVD processes. The rotary shafts 5 and 6 are aligned with each other on a common center line of rotation C, and the turntables 2 and 3 are attached to the opposing free ends of the rotary shafts 5 and 6. The turntables are thus placed opposite to each other defining a prescribed gap A between them. The base B is further provided with a pair of heater units 4 and 5 which are placed opposite to the other surfaces of the turntables 2 and 3. The turntables 2 and 3, the rotary shafts 5 and 6 and the heater units 4 and 5 are thus placed symmetrically around the center line of rotation C.

Preferably, the center line of rotation C is disposed horizontally, and the surfaces of the turntables are therefore disposed vertically. The rotary shafts 5 and 6 are adapted to be turned by a motor unit not shown in the drawing. The turntables 2 and 3 comprise annular susceptors 8 and 9 which are disposed concentrically around the center line of rotation C, and are made of chemically stable material such as carbon. A plurality of wafers 1 are retained on the opposing surfaces of these susceptors 8 and 9, and are arranged circumferentially or concentrically on each susceptor surface.

One of the rotary shafts 6 is internally and coaxially fitted with a conduit 10 for introducing material gas into the gap A between the two turntables 2 and 3. The material gas uniformly flows in radially outward direction, and undergoes a chemical reaction over the surfaces of the wafers 1, thereby depositing a desired film over the surfaces of the wafers 1. The exhaust gas which is produced from the chemical reaction is expelled from an exit defined by a pair of guide members 11 and 12 attached to the heater units 4 and 5 along the outer periphery of the gap A between the two turntables 2 and 3, and is removed out of the reaction chamber by means not shown in the drawing.

As the reaction gas flows out of the opening of the conduit 10 radially in a uniform manner, it is heated by the heater units 4 and 5 and tends to rise vertically. Because of the rotation of the turntables 2 and 3, the wafers 1 move up and down and are uniformly exposed to the material gas despite the tendency of the material gas to move upward. By turning the turntables 2 and 3 in mutually opposite directions, the wafers 1 can be even more uniformly exposed to the material gas.

The heater units 4 and 5 each comprise a plurality of resistive annular heaters 13, annular grooves 14 formed in the base B facing the backside of the corresponding turntable for receiving the corresponding heaters, and a cover plate 16 placed over the grooves 14. The grooves 14 are concentrically disposed around the center line of rotation C, and are therefore given with different diameters depending on the distance from the center line of rotation C. The heaters 13 are adapted to the dimensions of these grooves 14, and each consist of an infrared heater or an infrared lamp having a required capacity for heating the gap A to a prescribed temperature.

The wall surface of each of the grooves 14 is finished as a mirror surface so as to reflect backward thermal radiation to forward. The cover plate 16 placed in front of the heaters 13 consists of quartz glass which transmits thermal radiation from the heaters 13 and is provided with required mechanical strength and properties. The base B is provided with seal grooves fitted with sealing members 17 along inner and outer peripheries of the cover plate 16. The bottom of each heater groove 14 communicates with a vacuum pump 20 via a conduit 19 so as to keep the interior of each heater groove 14 to a higher level of vacuum than the remaining part of the reaction chamber. For instance, when the pressure inside the reaction chamber is $10^{-2}$ Torr, the pressure inside each heater groove may be $10^{-3}$ Torr. The pressure difference pushes the cover plate 16 onto the heater base, and this ensures the interior of each heater groove 14 to remain at the proper vacuum level. Thus, the intrusion of the material gas into the heater grooves 14 and the resulting deposition of material in the heater grooves 14 can be effectively avoided. The cover plate 16 is subjected to the stress due to the pressure difference. However, the cover plate 16 is supported at a plurality of points by the land regions 15 defined in the base B between the heater grooves 14.

The size of the gap A can influence the velocity of the material gas, and thus the final result of the CVD process. By allowing the size of the gap A to be adjusted, for instance by moving one of the rotary shafts 7 in the axial direction as indicated by the arrow D, it is possible to finely adjust the conditions of the CVD process.

According to this arrangement, the turntables opposing each serve as flow control surfaces which are mostly covered by wafers so that the extraneous deposition of material on the walls of the reaction chamber can be minimized. This is advantageous in terms of both easing the work required for maintaining the CVD system, and reducing the waste of the material gas. Also, the placement of the heaters near the backside of the wafers results in a uniform temperature distribution which is beneficial in maintaining the quality of the final products.

This arrangement additionally allows an efficient utilization of the space inside the reaction chamber, and can thereby improve the productivity of the CVD system. Also, combined with the provision of a heater unit behind each of the susceptors, a high level of thermal efficiency and a uniform temperature distribution can be achieved.

Although the present invention has been described in terms of a preferred embodiment thereof, it is obvious to a person skilled in the art that various alterations and modifications are possible without departing from the scope of the present invention which is set forth in the appended claims.

What is claimed is:

1. A chemical vapor deposition system comprising:
    a pair of base members defining a pair of mutually opposing surfaces;
    a pair of circular susceptors placed opposite to each other between said opposing surfaces of said base members defining a gap between said susceptors and having opposing surfaces adapted to retain wafers thereon;
    a conduit for passing material gas through said gap;
    a plurality of concentric annular grooves formed in each of said opposing surfaces of said base members;
    a plurality of radiation heater elements each received in a corresponding one of said annular grooves; and
    a pair of guide members each attached to the corresponding one of said base members and extending along an outer periphery of the corresponding one of said suspcetors.

2. A chemical vapor deposition system according to claim 1, wherein said wafer retaining surfaces of said susceptors are disposed parallel to each other.

3. A chemical vapor deposition system according to claim 1, wherein said wafer retaining surfaces of said susceptors are disposed vertically.

4. A chemical vapor deposition system according to claim 1, wherein said susceptors are supported by turntables each having a rotary shaft which passes through a corresponding one of said base members.

5. A chemical vapor deposition system according to claim 4, wherein said turntables rotate in mutually opposing directions.

6. A chemical vapor deposition system according to claim 4, wherein said wafer retaining surfaces of said susceptors are adapted to retain a plurality of wafers in a concentric arrangement.

7. A chemical vapor deposition system according to claim 4, wherein said conduit for passing materials through said gap is received in said rotary shaft of one of said turntables, and provided with an opening communicating with said gap.

8. A chemical vapor deposition system according to claim 1, wherein at least one of said susceptors is moveable toward and away from the other susceptor.

9. A chemical vapor deposition system according to claim 1, further comprising a pair of cover plates each placed over a corresponding one of said opposing surfaces of said base members by a seal member so as to enclose the annular grooves receiving said radiation heater elements.

10. A chemical vapor deposition system according to claim 1, further comprising a vacuum pump, and a conduit allowing communication of said annular grooves with an inlet of said water pump.

* * * * *

UNITED STATES PATENT AND TRADEMARK OFFICE
CERTIFICATE OF CORRECTION

PATENT NO. : 6,254,687 B1
DATED : July 3, 2001
INVENTOR(S) : Ichiro Takahashi

It is certified that error appears in the above-identified patent and that said Letters Patent is hereby corrected as shown below:

<u>Title page,</u>
Line 1 of section [73] Assignee: delete "Japan Process Engineering, Ltd." and insert -- Ichiro Takahashi --.

Signed and Sealed this

Ninth Day of October, 2001

Attest:

NICHOLAS P. GODICI
Attesting Officer
Acting Director of the United States Patent and Trademark Office